United States Patent [19]
Seevinck

[11] Patent Number: 5,253,137
[45] Date of Patent: Oct. 12, 1993

[54] INTEGRATED CIRCUIT HAVING A SENSE AMPLIFIER

[75] Inventor: Evert Seevinck, Eindhoven, Netherlands

[73] Assignee: U.S. Philips Corp., New York, N.Y.

[21] Appl. No.: 707,556

[22] Filed: May 30, 1991

Related U.S. Application Data

[63] Continuation-in-part of Ser. No. 532,468, May 31, 1990.

[30] Foreign Application Priority Data

May 31, 1989 [NL] Netherlands .......................... 8901376

[51] Int. Cl.⁵ ............................................. G11C 13/00
[52] U.S. Cl. .............................. 365/230.01; 365/190; 307/530
[58] Field of Search ................... 365/226, 228, 230.01, 365/189.01, 190; 307/530

[56] References Cited

U.S. PATENT DOCUMENTS 4,953,127 8/1990 Nagahashi et al. .................. 365/190

Primary Examiner—Terrell W. Fears
Attorney, Agent, or Firm—Steven R. Biren

[57] ABSTRACT

An integrated circuit includes a sense amplifier which has an equalizing effect on voltages on the inputs of the sense amplifier, in particular during readout of the sense amplifier. The sense amplifier includes a parallel connection of a first and second current branch, each current branch including a control transistor, the source of which is connected to a relevant input, and the gate of which is connected to the drain of the control transistor in the other current branch, and a load transistor, whose gate receives a selection signal being connected in each said current branch in series with the control transistor. During readout, the gate of the load transistor is driven so as to make the channel of the load transistor conductive.

10 Claims, 1 Drawing Sheet

INTEGRATED CIRCUIT HAVING A SENSE AMPLIFIER

This application is a continuation in part of U.S. Ser. No. 07/532,468 filed May 31, 1990 pending.

BACKGROUND OF THE INVENTION

The invention relates to an integrated circuit, comprising driving means connected to a bit line and a non-bit line. The invention also relates to an integrated field-effect transistor memory circuit comprising memory cells which are arranged in rows and columns, each column of memory cells being connected to a bit line and a non-bit line by way of selection means. The integrated circuits or integrated field effect transistor memory circuits to which the invention relate also comprise at least one sense amplifier which comprises a first and a second input for coupling to the bit line and the associated non-bit line, which sense amplifier performs a current measurement on the first and the second input during the reading of information on the first and the second input.

A memory circuit of this kind is known from the article "Design tricks speed up INMOS's SRAMS" in "Electronics", Apr. 16, 1987, p. 34. The cited article describes a memory circuit in which a sense amplifier senses and amplifies the information on bit lines by detection of current instead of detection of voltage differences. Consequently, the processing speed of such a sense amplifier is substantially independent of the parasitic bit line capacitance, so that a memory design may be simpler. However, the cited article gives no details on how a suitable sense amplifier can be realized in a simple circuit.

SUMMARY OF THE INVENTION

It is, inter alia, an object of the invention to provide an implementation of an integrated circuit and an integrated memory circuit with a current sense amplifier. It is a further object of the invention to provide an implementation of an integrated circuit and an integrated memory circuit in which also the susceptibility to interference is minimized.

To achieve this, an integrated circuit according to the invention comprises driving means connected to a bit line and a non-bit line, the bit line and the non-bit line being coupled to a first supply terminal via a load, and to a second supply terminal via a sense amplifier, the sense amplifier comprising a parallel connection of a first and second current branch, each current branch comprising a series arrangement of control transistor and a load transistor of the same conductivity type, respective sources of the control transistor in the first and the second current branch being coupled to the bit line and non-bit line respectively, the gate of the control transistor in each current branch being connected to the drain of the control transistor in the other current branch, channels of the respective load transistors in each current branch coupling the drain of the control transistor to the second supply terminal, the integrated circuit comprising means for driving the gates of the load transistors so as to make the channels of the load transistors conduct during readout of the sense amplifier.

The integrated memory circuit in accordance with the invention offers the advantage that the sense amplifier is constructed using only 4 transistors, the 4 transistors providing full equalization of the voltages on the inputs of the sense amplifier.

It is noted that a sense amplifier with a similar structure is known from U.S. Pat. No. 4,039,861. However, in this patent the sense amplifier is used as a charge amplifier in an integrated circuit in which the load transistors are switched off during readout, disabling current through the current branches.

An embodiment of an integrated memory circuit in accordance with the invention is characterized in that the load transistor and the control transistor in each current branch are P-type transistors. Because bit lines in a memory circuit are usually precharged to almost the positive supply voltage in order to sustain the data integrity of the memory cell during the reading of the cell, the absolute voltage difference between the gate and the source of the control transistor should be greater than the threshold voltage of this transistor. When instead of P-type N-type control transistors are used, therefore, the gate voltage should usually be higher than the positive supply voltage, thus necessitating the use of an additional circuit, its generation.

Another embodiment of an integrated memory circuit in accordance with the invention is characterized in that a width/length ratio (W/L) of the load transistor in each current branch is substantially equal to the width/length ratio (W/L) of the control transistor. Simulations performed on such a memory circuit have demonstrated that the voltages on the gates of the control transistors are thus not latched to one of the voltages on the supply terminals. Consequently, a sense amplifier in an integrated memory circuit in accordance with the invention is a self-restoring type, thus preventing the setting of one of the transistors from leaving the saturation region. Moreover, the implementation of such a sense amplifier on a chip is very simple.

Embodiments in accordance with the invention will be described in detail hereinafter with reference to the drawing.

DESCRIPTION OF A PREFERRED EMBODIMENTS

Figure 1:
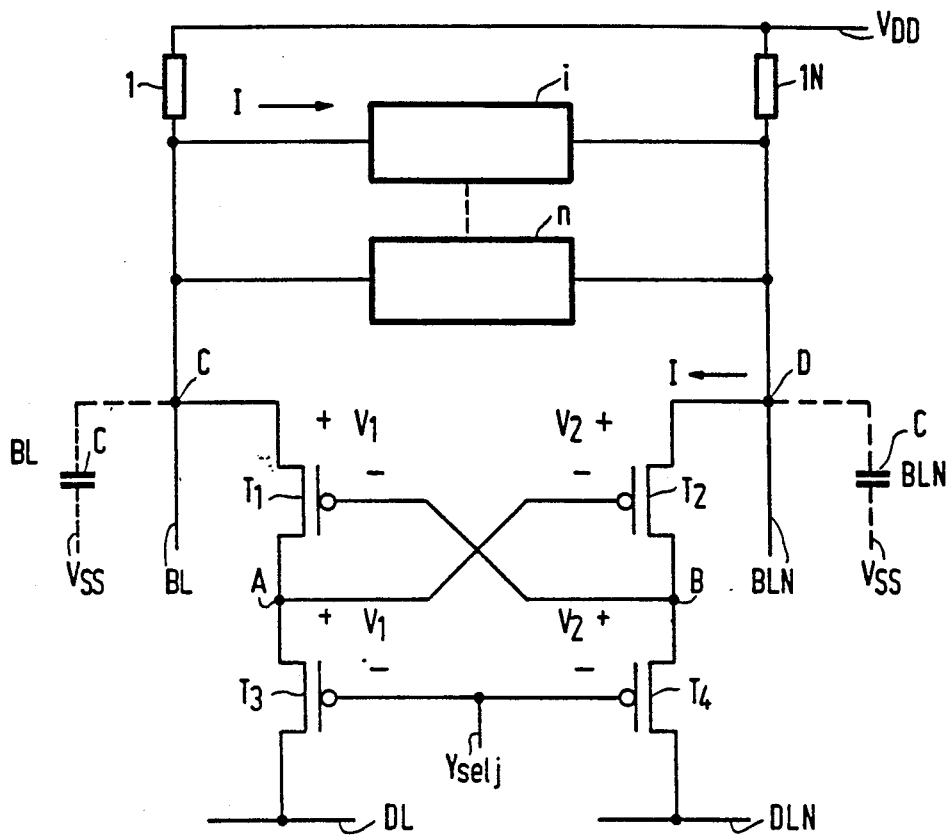
FIG. 1 shows an embodiment of a sense amplifier in accordance with the invention.

FIG. 1 shows an embodiment of a sense amplifier in accordance with the invention. The sense amplifier comprises 4 PMOS-transistors T1, T2, T3 and T4. The sources of the transistors T1 and T2 are connected to the first input C and the second input D, respectively, of the sense amplifier. The junction points C and D are also connected to bit lines BL and BLN of a memory column, which bit lines BL and BLN are each connected to the supply terminal VDD via a load 1 and a load 1N, respectively. A number of N memory cells, only two of which are shown in FIG. 1 for the sake of clarity, are connected to the bit lines BL and BLN. Using known techniques, a single memory cell in a memory column can be selected, that is to say by way of row selection transistors which connect the bit line and the non-bit line to the memory cell. The drain of the transistors T1 and T2 is connected to the source of the transistors T3 and T4, respectively, and to junction points A and B, respectively. The drains of the transistors T3 and T4 are connected to data lines DL and DLN, respectively. The gates of the transistors T3 and T4 receive a common selection signal YSELj. The selection signal YSEL selects a column j, where $1 \leq j \leq m$. The gates of the transistors T1 and T2 are connected to the drains of the transistors T2 and T1, respectively. The bit lines BL and BLN have a parasitic bit line capacitance CBL and CBLN, respectively, shown in parallel between respective junction points C and D and the supply terminal VSS in FIG. 1.

The operation of the circuit shown in FIG. 1 is as follows: the bit lines BL and BLN are first charged via the load 1, so that the setting voltage on the junction points C and D assumes a value between the voltages on the supply terminals VSS and VDD (usually approximately 4 in the case of a supply voltage amounting to 5). Consequently, the junction points A and B carry a voltage which is one threshold voltage of the transistors T1 and T2 lower than the set voltage on the junction points C and D (approximately 3 for a threshold voltage of approximately 1 for a set voltage of approximately 4). When the selection signal YSEL is subsequently logic low, the transistors T3 and T4 are turned on. The transistors T1, T2, T3 and T4 are proportioned so that they are all operative in the saturation region when information on the bit lines BL and BLN is read by the sense amplifier. For substantially the same dimensions of the transistors T1 and T3, and T2 and T4, respectively, the voltage differences between the gate and the source of the transistors T1 and T3, and T2 and T4, respectively, are the same because of the equal current through the transistors T1 and T3, and T2 and T4, respectively. For a voltage difference V1 and V2 between the gate and the source of the transistors T1 and T3, and T2 and T4, respectively, the junction points A and B carry a voltage V1 and V2, respectively (selection signal YSELj is logic low). The gate of the respective transistor T1 and T2 thus carries a voltage V2 and V1, respectively. The junction points C and D thus carry a voltage (V1+V2). After the selection of a single memory cell i in the column j, either the junction point C or the junction point D will be slightly discharged by a discharge current I, depending on the information in the memory cell i. By way of example it is assumed in FIG. 1 that the junction point C is slightly discharged. The voltage on the junction point C slightly decreases due to the discharge current I. Because the voltages on the junction points C and D, however, are maintained equal by the sense amplifier in accordance with the invention (equalization effect), the sense amplifier also decreases the voltage on the junction point D to the same extent as the voltage decrease on the junction point C. Said voltage decrease on the junction point D is realized by way of a discharge current I. The difference between the drain currents of the transistors T3 and T4 amounts to the current I, being equal to the discharge current I of the memory cell i. Because of the intrinsic equalization effect on the voltages on the junction points C and D (being connected to the bit lines BL and BLN), a sense amplifier in accordance with the invention offers the advantage that the sensing delay of the sense amplifier is substantially independent of the bit line capacitance CBL or CBLN, because no or substantially no discharging of the bit line capacitance is required for reading the information in the memory cell i.

Simulations performed on a sense amplifier in accordance with the invention have demonstrated that for substantially the same width/length ratio (W/L) of the transistors T1 and T3, and T2 and T4, respectively, the voltages on the junction points A and B are not latched to one of the voltages on the supply terminals. This offers the advantage that a sense amplifier in accordance with the invention is self-restoring, so that the setting of the transistor T3 or T4 will not leave the saturation region.

There are two ways of deriving an output signal from the sense amplifier: first of all by measurement of a voltage difference on the junction points A and B, and secondly via a difference in currents through the first current branch, via the transistors T1 and T3, to the data line DL and through the second current branch, via the transistors T2 and T4, to the non-data line DLN.

In the first case a voltage difference will occur between the junction points A and B due to the appearance of a difference current I through the transistors T3 and T4. For a further amplification the junction points A and B may be connected to a further sense amplifier stage, in which case the drains of the transistors T3 and T4 can be connected to the supply terminal VSS.

In the second case the currents through the transistors T3 and T4 can be applied to a second amplifier stage, via the data lines DL and DLN, in which a current difference can be converted into a difference voltage.

Figure 2:
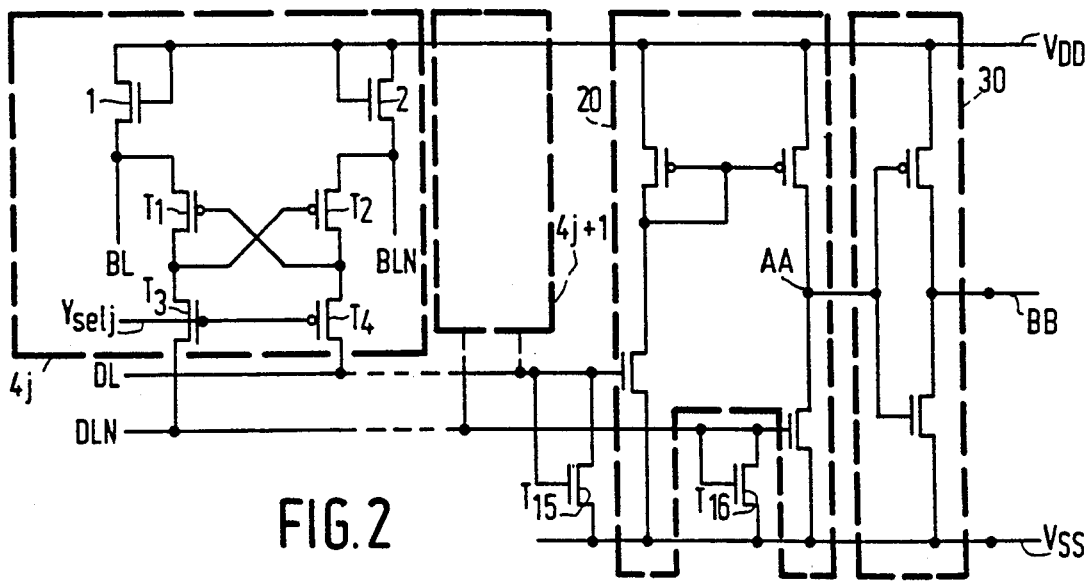
FIG. 2 shows an embodiment of an integrated memory circuit comprising several sense amplifiers in accordance with the invention.

FIG. 2 shows an embodiment of an integrated memory circuit in accordance with the invention which comprises several sense amplifiers 4j, 4j+1 etc, whose output signals are applied to the data lines DL and DLN via mutually different currents. Elements in FIG. 2 which correspond to elements of FIG. 1 are denoted by corresponding references. The outputs of the sense amplifiers 4j, 4j+1 etc. are connected to common data lines DL and DLN. The sense amplifiers 4j+1 etc. are constructed in the same way as the sense amplifier 4j. The memory cells i in the column j and the bit line capacitances CBL and CBLN have been omitted in FIG. 2 for the sake of clarity, but are indeed present in the circuit. The loads 1 and 1N of FIG. 1 consist of NMOS-transistors 1 which are connected as diodes. However, they may alternatively be formed by PMOS-transistors connected as diodes. Between each of the data lines DL and DLN and the supply terminal VSS there is included an NMOS-transistor T15, T16, respectively, connected as a diode. Furthermore, a further amplifier stage 20 is connected to the data lines DL and DLN. A buffer circuit 30 is connected to output AA of the amplifier stage 20, which buffer circuit produces an output signal on output BB.

The operation of the circuit shown in FIG. 2 is as follows: after the selection of a single desired sense amplifier 4j in a memory column j by means of a selection signal YSELj, the information is transferred from a selected memory cell i in the relevant column j to the data lines DL and DLN by way of currents which are mutually different. The currents through the data lines DL and DLN are applied to the supply terminal VSS by means of the transistors T15 and T16, said currents being converted into voltages because of the diode effect of T15 and T16. Because the value of the currents through the data lines DL and DLN differs (i.e. the current I), different voltages are applied to the inputs of the further amplifier stage 20. The input signals are further amplified in the amplifier stage 20 and applied, via the output AA, to a buffer circuit 30. The buffer circuit 30 outputs an output signal having CMOS output levels on the output BB.

Although, in discussing FIG. 1, the invention has been shown applied to a memory circuit, the skilled person will appreciate that the sense amplifier according to the invention is not limited to memory circuits. Any type of driving means may fill the role of the memory cells "i", "n", and benefit from the advantages of the sense amplifier described. Moreover, it is not necessary that both the bit line 1 and the non-bit line 1n are driven in dependence of information to be transmitted: it is sufficient that one line carries information, the other line may then be fed with at an information independent reference source.

I claim:

1. An integrated field-effect transistor memory circuit comprising memory cells which are arranged in rows and columns, each column of memory cells being connected to a bit line and a non-bit line by way of selection means, and also comprising at least one sense amplifier which comprises a first and a second input for coupling respectively to a bit line and an associated non-bit line of a column, each of which is coupled to a supply terminal via a load, which sense amplifier performs a current measurement on the first and the second input during the reading of information on the first and the second input, and which sense amplifier comprises a parallel connection of a first and a second current branch, each current branch comprising a control transistor having a gate, a source and a drain, the source of the control transistor in the first and the second current branch being connected to the first and the second input, respectively, characterized in that the sense amplifier also equalizes the voltages on the first and the second input during the current measurement, the gate of the control transistor in each current branch being connected to the drain of the control transistor in the other current branch, the channel of a load transistor, comprising a gate, a source and a drain, being connected between the drain of the relevant control transistor and a supply terminal in each current branch, said load transistor being of the same conductivity type as the control transistor in the relevant current branch, the coupled gates of said load transistors receiving a selection signal for the selective activation of the sense amplifier.

2. An integrated field-effect transistor memory circuit as claimed in claim 1, characterized in that the load transistor and the control transistor in each current branch are P-type transistors.

3. An integrated field-effect transistor memory circuit as claimed in claim 1, comprising a plurality of sense amplifiers which are connected to the same data bus at the output side, characterized in that between the data bus and a supply terminal there is included a field-effect transistor which is connected as a diode.

4. An integrated field-effect transistor memory circuit as claimed in claim 1, characterized in that a width/length ratio (W/L) of the load transistor in each current branch is substantially equal to the width/length ratio (W/L) of the control transistor.

5. An integrated circuit comprising driving means connected to a bit line and a non-bit line, the bit line and the non-bit line each being coupled to a first supply terminal via a load, and to a second supply terminal via a sense amplifier, the sense amplifier comprising a parallel connection of a first and second current branch, each current branch comprising a series arrangement of control transistor and a load transistor of the same conductivity type, respective sources of the control transistor in the first and the second current branch being coupled to the bit line and non-bit line respectively, the gate of the control transistor in each current branch being connected to the drain of the control transistor in the other current branch, channels of the respective load transistors in each current branch coupling the drain of the control transistor to the second supply terminal, the integrated circuit further comprising means for driving the gates of the load transistors so as to make the channels of the load transistors conduct during readout of the sense amplifier.

6. An integrated circuit as claimed in claim 5, characterized in that the load transistor and the control transistor in each current branch are P-type transistors.

7. An integrated circuit as claimed in claim 5, characterized in that a width/length ratio (W/L) of the load transistor in each current branch is substantially equal to the width/length ratio (W/L) of the control transistor in that current branch.

8. An integrated circuit according to claim 5, in which the driving means comprises a plurality of memory cells of a field effect transistor memory, all memory cells from the plurality being connected to the bit line and the non-bit line by way of respective selection means.

9. An integrated circuit comprising driving means connected to a plurality of pairs of lines constituting a bit line and a non-bit line, the bit line and non-bit line from each pair each being coupled to a first supply terminal via a particular load, and to a second supply terminal via a particular sense amplifier to which the pair of lines corresponds, each particular sense amplifier comprising a parallel connection of a first and second current branch, each current branch comprising a series arrangement of a control transistor and a load transistor of the same conductivity type, respective sources of the control transistor in the first and the second current branch being coupled to the corresponding bit line and non-bit line respectively, the gate of the control transistor in each current branch of each particular sense amplifier being connected to the drain of the control transistor in the other current branch in the same particular sense amplifier, the channels of the load transistors in each particular sense amplifier coupling the drains of the control transistor in the first and second current branches of each sense amplifier respectively to a first and second conductor of a data bus, first and second field-effect transistors connected as diodes respectively coupling the first and second conductors of the data bus to the second power supply terminal, the integrated circuit further comprising means for driving the gates of the load transistors of a selected sense amplifier so as to make the channels of the load transistors of the selected sense amplifier conduct during readout of the selected sense amplifier via the data bus.

10. An integrated circuit according to claim 9, in which the driving means comprises columns of rows of memory cells of a field effect transistor memory, each column corresponding to a particular sense amplifier, memory cells from each particular column being connected by way of selection means to the corresponding bit line and the non-bit line.

* * * * *